United States Patent [19]

Coller

[11] 4,068,374
[45] Jan. 17, 1978

[54] TOOL FOR REMOVING AND INSTALLING CONNECTOR

[75] Inventor: James Ray Coller, Mechanicsburg, Pa.

[73] Assignee: AMP Incorporated, Harrisburg, Pa.

[21] Appl. No.: 754,308

[22] Filed: Dec. 27, 1976

[51] Int. Cl.² ............................................ H01R 43/00
[52] U.S. Cl. ...................................... 29/747; 29/758; 29/764; 269/236
[58] Field of Search ................. 29/741, 764, 747, 752, 29/758; 269/236

[56] References Cited

U.S. PATENT DOCUMENTS

| 1,297,539 | 3/1919 | Bull | 269/236 X |
| 3,546,765 | 12/1970 | Schenk | 29/764 |
| 3,769,680 | 11/1973 | Anhalt | 29/764 |
| 3,896,533 | 7/1955 | Ullman et al. | 29/764 X |

*Primary Examiner*—Carl E. Hall
*Attorney, Agent, or Firm*—Donald W. Phillion

[57] ABSTRACT

The disclosure relates to a tool for installing and removing a housing which is positioned over a row of connector pairs and frictionally engaged with the rows of connector pairs, there being no integral connection between the housing and the contacts. The tool is designed to remove the housing when positioned over the contact members by utilizing a wedge on the tool which separates the contact members so that the housing can be pulled up over the contact members without rubbing thereagainst to remove any plating layers thereon. The housing is installed by the same tool wherein the housing is gripped and, upon insertion of the housing over the contact members, the wedge first spreads the contact members apart and the housing is disposed thereover without rubbing against the contact members. In the case of installation and removal of the housing member, the wedge is designed to push the contacts sufficiently far back so that they do not rest upon a preloading bar disposed within the housing. In this way, the housing can be removed by merely gripping the housing with the tool while the contacts are spread apart and then rocking the housing back and forth so that it can be removed upwardly over the contact members without sliding over the edges of the contact members. The installation would also require a gripping of the housing member but would not require the rocking motion, the housing being installed by a direct downward force thereon.

11 Claims, 5 Drawing Figures

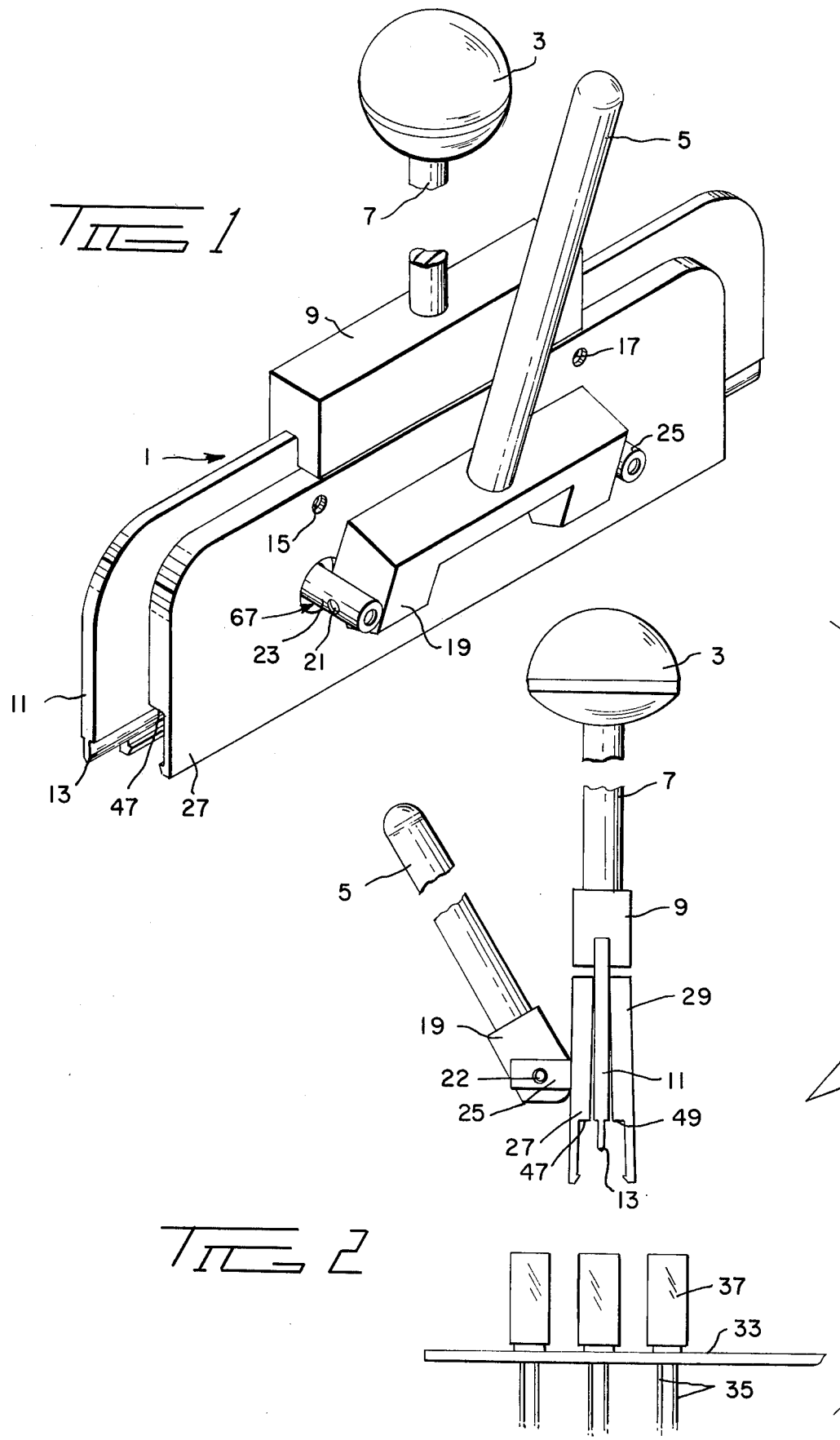

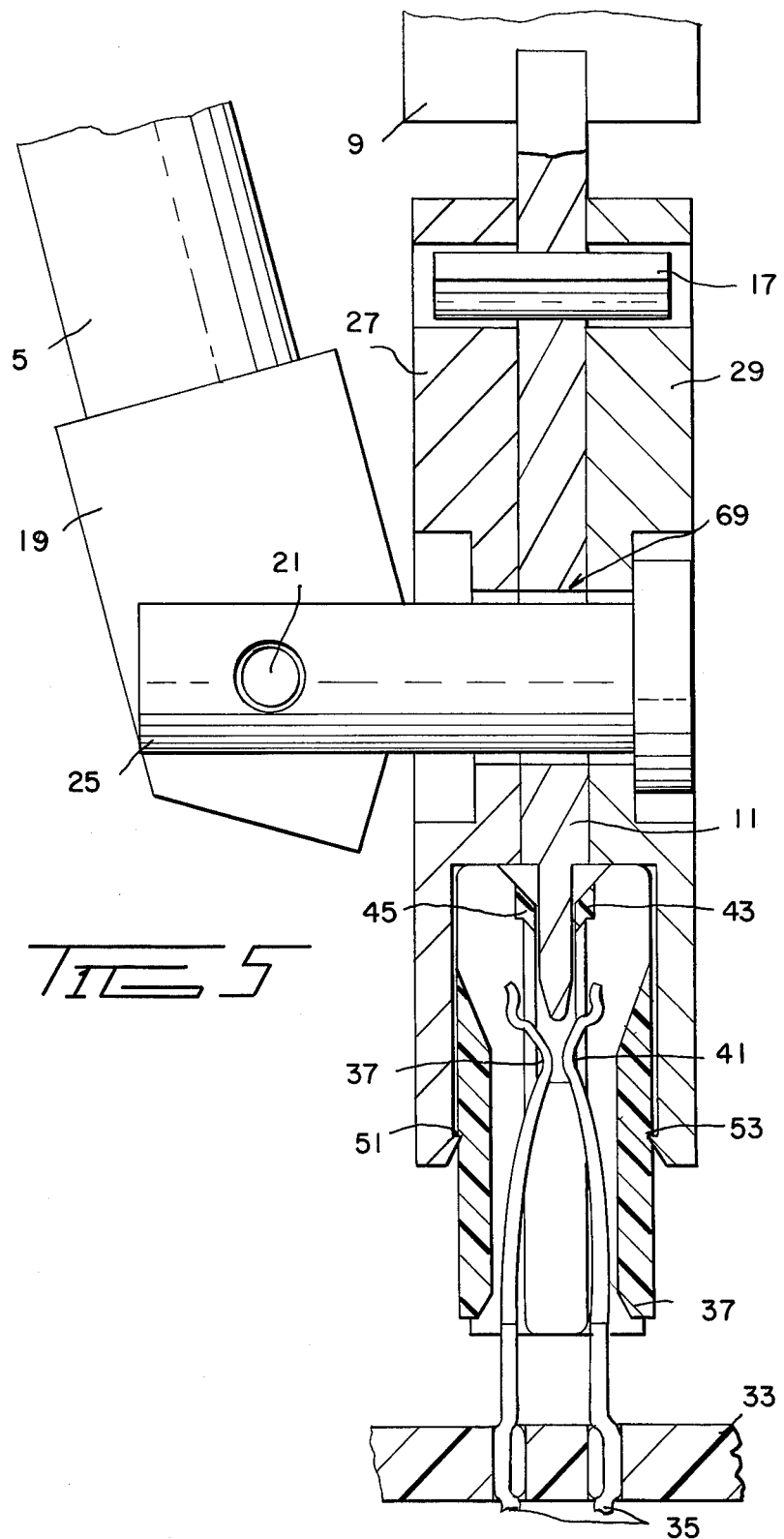

TOOL FOR REMOVING AND INSTALLING CONNECTOR

This invention relates to a tool which is capable of installing and removing a housing from a row of contact pairs wherein the housing is not rigidly fixed to the contact members and wherein the housing is installed and removed without rubbing the contacting edges of the contact members.

A very common type of electrical connector involves the installation of individual contact member pairs into apertures in printed circuit boards and the like, whereby the contact member pairs are formed in rows. In order to make electrical connection with the contact member pairs, it is necessary to have a housing associated with the row of connector pairs for holding and securing to a housing member from a mating connector member. The housing in this case is disposed over the contact members and is not rigidly connected thereto but is merely held in place by frictional forces and rests on or over the printed circuit board without being secured thereto. Housing members of this type include a preloading bar against which the contact members can rest to provide the frictional retention of the housing member. An electrical connector of this type is shown in Ser. No. 682,921, filed May 4, 1976 of Robert F. Cobaugh et al. Often, housing members of this type have to be removed from the associated row of connector pairs for reasons of replacing a connector pair member which has broken or bent, for replacement of a damaged housing or for other reasons. In accordance with the prior art, a separate tool has been required for removing housings of this type and a further separate tool has been required for installation of housings of this type. This is because it is necessary that the housing be removed by applying a rocking motion thereto while being sure that the housing does not rub the edges of the contact members and remove platings therefrom, such as gold, and in other ways damage the contact surfaces. The installation, on the other hand, has required that the housing be applied over the row of contact pairs with a great deal of force applied, yet without rubbing against the edges of the contact member pairs. For this reason, when service has been required upon electrical connectors of this type in the field, the operator or serviceman was required to use at least two tools and had a great deal of difficulty in removing or installing the housing, in any event, without rubbing of the edges of the contact member pairs.

In accordance with the present invention, there is provided a single tool which can be used in the field and easily install or remove contact member housings of the type described above with the concommitant substantial reduction in damage to the contact member pairs during installation and removal of the housing. Briefly, this is accomplished by providing a tool to remove the housing when positioned over the contact members by utilizing a wedge on the tool which separates the contact members so that the housing can be pulled up over the contact members without rubbing thereagainst to remove any plating layers thereon. The housing is installed by the same tool wherein the housing is gripped and, upon insertion of the housing over the contact members, the wedge first spreads the contact members apart and the housing is disposed thereover without rubbing against the contact members. In the case of installation and removal of the housing member, the wedge is designed to push the contacts sufficiently far back so that they do not rest upon a preloading bar disposed within the housing. In this way, the housing can be removed by merely gripping the housing with the tool while the contacts are spread apart and then rocking the housing back and forth so that it can be removed upwardly over the contact members without sliding over the edges of the contact members. The installation would also require a gripping of the housing member but would not require the rocking motion, the housing being installed by a direct downward force thereon with the contact member biased away from the preloading bar on the housing by the wedge on the tool.

It is therefore an object of this invention to provide a unitary tool which is capable of both installing and removing housing members of the type described above.

It is a further object of this invention to provide a tool capable of installing and removing housing members from about contact member pairs without rubbing the contact member edges.

It is a yet further object of this invention to provide a tool for removing and installing housing members which include a wedge for removing contact member pairs from the path of travel of the housing during housing installation and removal.

The above objects and still further objects of this invention will immediately become apparent to those skilled in the art after consideration of the following preferred embodiment thereof, which is provided by way of example and not by way of limitation wherein:

FIG. 1 is a three dimensional view of a tool in accordance with the present invention;

FIG. 2 is a side view of a tool in accordance with the present invention in the open position as it would be applied to a housing on a printed circuit board for housing removal;

FIG. 5 is a cross-section of the tool in accordance with the present invention with the housing after partial removal thereof from about a row of contact pairs.

Figure 3:
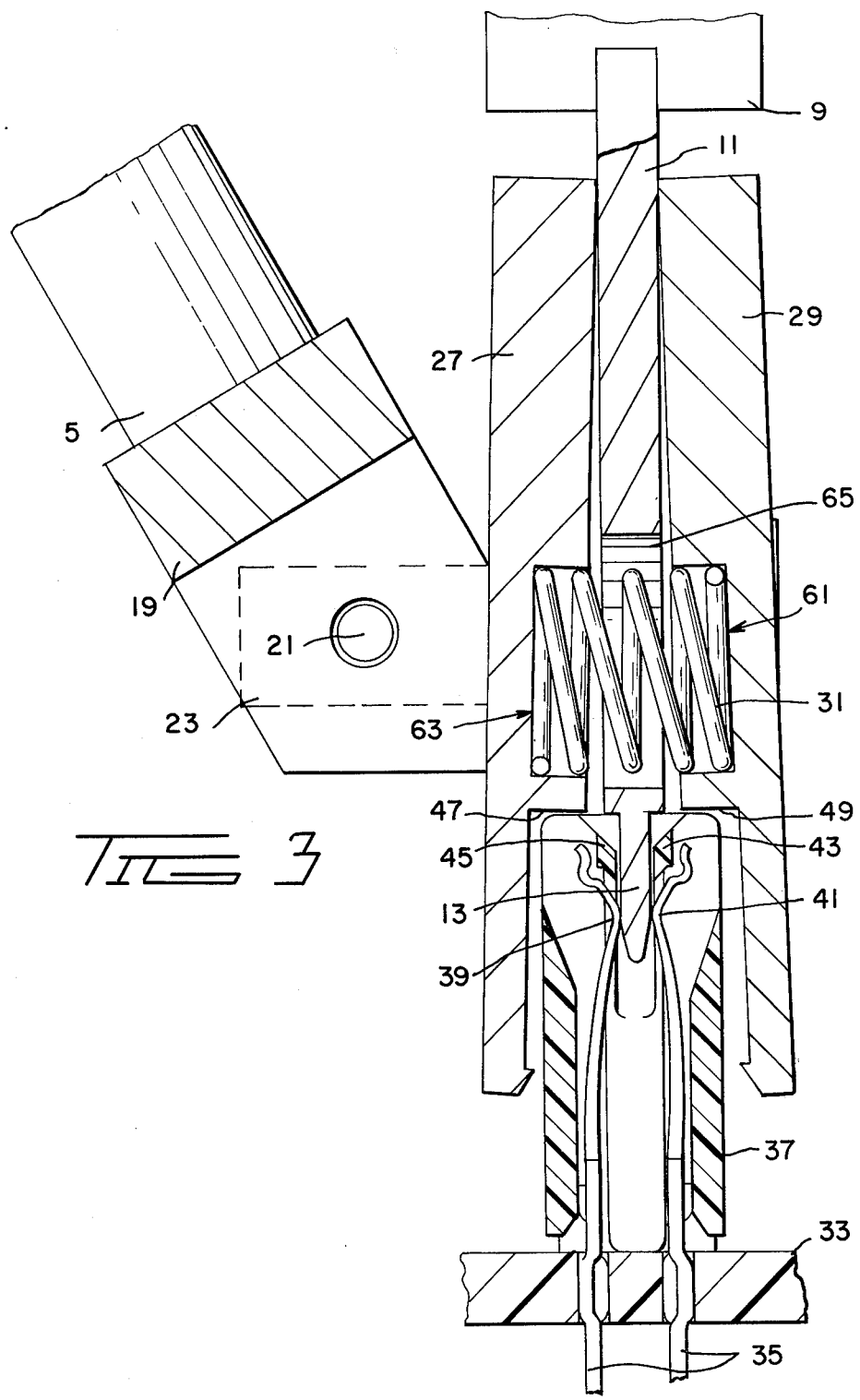
FIG. 3 is a cross-sectional view of the tool of the present invention when initially contacting a housing member for removal.
Figure 4:
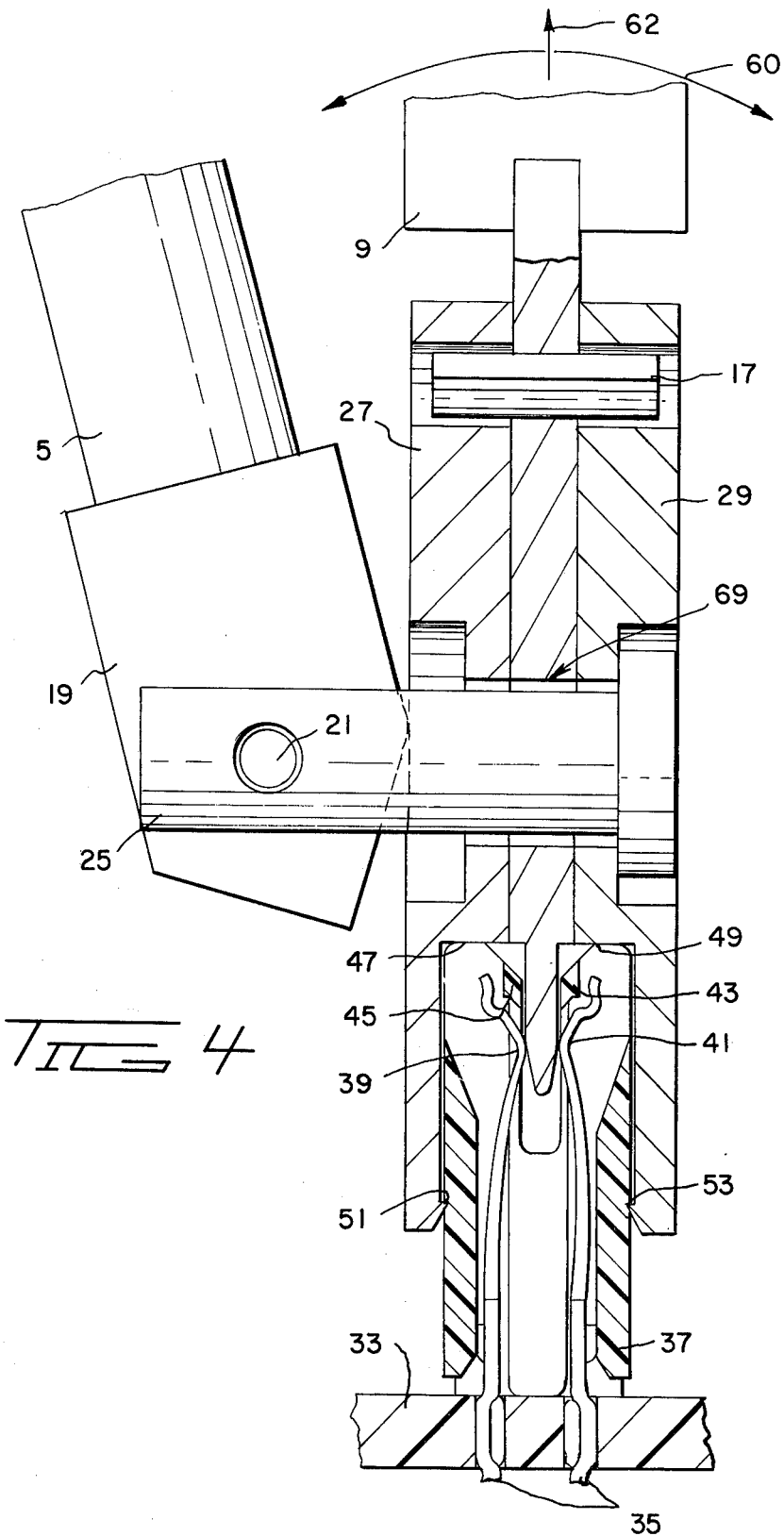
FIG. 4 is a cross-sectional view of the tool in accordance with the present invention and a housing member during rocking and removal of the housing.

Referring now to FIGS. 1 to 3, there is shown the tool in accordance with the present invention. The tool includes a gripping handle 3 and a camming handle 5. The gripping handle 3 is connected to a body 9 by means of a shaft 7. The body 9 is rigidly secured over a wedge member 11 and is spaced from side members 27 and 29. The wedge member 11 includes a wedge tip 13, the purpose of which will be explained in more detail hereinbelow. The sides 27 and 29 and the wedge 11 are secured together at the top of the sides by means of screws, rivets or the like 15 and 17. This connection is sufficiently flexible so that the walls 27 and 29 can separate from the wedge 11 as shown in FIGS. 2 and 3. This separation is provided by means of a biasing spring 31 (FIG. 3) disposed in recesses 61 and 63 in side walls 29 and 27 with spring 31 passing through aperture 65 in wedge member 11, which acts to separate the sides 27 and 29 when no force is applied. The camming handle 5 is connected to a cam 19 which is pivotally secured by means of pivots 21 and 22 to a pair of rods 23 and 25 which pass through apertures 67 (one shown) in side member 27 and apertures 69 (one shown) in the wedge 11 and are secured to the side 29 as best shown in FIG. 4. Also shown in FIG. 2 is a printed circuit board 33 with rows of contact pairs 35 over which a housing 37 of the type described above has been disposed. It will be seen in FIG. 2 that the housing 37 does not have to contact the printed circuit board 33, though this is not a requirement.

When the camming handle 5 is moved to the left as shown in FIGS. 2 and 3 or the right as shown in FIG. 1, the spring 31 will apply its force to the sides 27 and 29 and spread the sides apart as shown in FIGS. 2 and 3. In this position, the tool is prepared for disposition over a housing 37. Referring now to FIG. 3, for housing removal, the tool as shown in FIG. 2 has been forced into the top of the housing 37 wherein, initially, the wedge tip 13 moves between contact edges 39 and 41 to move these contact edges away from the preloading bar 43 and 45 of the housing 37. The tool is forced downwardly until the lower edges 47 and 49 of sides 27 and 29 contact the upper surface of the housing 37 as shown in FIG. 3. This is accomplished by a downward force being applied to the gripping handle 3 until the position shown in FIG. 3 is achieved.

At this point, with reference to FIG. 4, the camming handle 5 is moved toward the right, thereby moving the rods 23 and 25 to the left due to the cam 19 and forcing the sides 27 and 29 to move together against the bias of the spring 31. This causes the flanges 51 and 53 at the base of the sides 27 and 29 to grip the sides of the housing 37. At this point, the gripping handle 3 will be moved in a rocking side-to-side motion as shown by the arrow 60 in FIG. 4 while the camming handle is held as closely as possible to handle 3 in the position shown in FIG. 4 with the handle 3 being gradually moved upwardly in the position shown by the upward arrow 62 in FIG. 4. With continued rocking and upward movement of the tool, the housing 37 will gradually be moved upward while the contact edges 39 and 41 are retained out of the path of travel of the housing 37 by the wedge tip 13. In this way, as shown in FIG. 5, the housing 37 will finally be completely removed, with the contact edges 39 and 41 disposed so that there will be no rubbing action between the contact edges and the housing during housing removal.

For housing installation, the reverse procedure is utilized. The housing 37 will at this point not be disposed over contact members but will be external to the system. The tool 1 will then be positioned over the housing 37 in the same manner described with respect to FIG. 3, except that there will be no contact members within the housing at this time. The tool will then be closed on the housing in the same manner as described with respect to FIG. 4 and the housing, locked in the tool 1, will then be forced over the contact members in the manner shown in FIG. 5 with a downward force being applied to the tool at the handle 3 in the opposite direction of the arrow 62 of FIG. 4 and in a downward direction. As the tool moves downwardly, the wedge tip 13 will first separate the contact edges 39 and 41 as in FIG. 4 and move the contact edges out of the path of travel of the housing. The housing will then continue to move downwardly until the preloading bar 43 and 45 is opposite the upper edges of the contact pair without any rubbing of the upper edges of the contact pairs taking place. At this point, the camming handle 5 will be moved to the left as shown in FIGS. 2 and 3 to force the flanges 51 and 53 away from the housing whereupon the tool can then be removed from the housing by a straight upward pull on the handle 3.

It can be seen that there has been provided a unitary tool which is capable of both removing and installing a housing of the type described without applying any rubbing or rasping of the contact edges during installation or removal. In addition, the entire procedure of installation and removal can be accomplished by a single tool, this not having been done with electrical connectors of the subject type in accordance with the prior art.

Though the invention has been described with respect to a specific preferred embodiment thereof, many variations and modifications thereof will immediately become apparent to those skilled in the art. It is therefore the intention that the appended claims be interpreted as broadly as possible in view of the prior art to include all such variations and modifications.

What is claimed is:

1. A tool for removing and installing a connector housing within which is disposed a row of elongated resilient connector pairs, wherein each of the connectors of a pair is anchored at one end in a circuit board and is provided with closely spaced confronting contact portions distal from the board, said connectors abutting an adjacent wall of the housing at a location spaced from the contact portions, said tool comprising wedge means including a wall member terminating at one end in a wedge tip for insertion between the contact portions of the connectors and a handle member at the opposite end, a pair of gripping elements mounted on one of said members for movement to engage the opposite walls of the housing between them while the wedge tip extends between the contact portions to remove said housing from the connectors while rocking it relative thereto, and camming means movably mounted on said tool for moving said gripping elements to engage said walls of the housing.

2. A tool according to claim 1 wherein the pair of gripping elements is mounted on said wall member.

3. A tool according to claim 2 wherein one of said gripping elements is mounted on each side of said wall member.

4. A tool according to claim 3 including means to normally bias said gripping elements apart.

5. A tool according to claim 1 including means to normally bias said gripping elements apart.

6. A tool according to claim 2 including means to normally bias said gripping elements apart.

7. A tool according to claim 3 including means to normally bias said gripping elements apart.

8. A tool according to claim 1 wherein said camming means includes a cam member pivotally secured to one of said gripping elements and engageable with the other of said gripping elements.

9. A tool according to claim 2 wherein said camming means includes a cam member pivotally secured to one of said gripping elements and engageable with the other of said gripping elements.

10. A tool according to claim 3 wherein said camming means includes a cam member pivotally secured to one of said gripping elements and engageable with the other of said gripping elements.

11. A tool according to claim 4 wherein said camming means includes a cam member pivotally secured to one of said gripping elements and engageable with the other of said gripping elements.

* * * * *